(12) United States Patent
Northcutt

(10) Patent No.: US 7,327,044 B2
(45) Date of Patent: Feb. 5, 2008

(54) INTEGRATED CIRCUIT PACKAGE ENCAPSULATING A HERMETICALLY SEALED DEVICE

(75) Inventor: James Bryan Northcutt, Lehigh Acres, FL (US)

(73) Assignee: Fox Electronics, Fort Meyers, FL (US)

( * ) Notice: Subject to any disclaimer, the term of this patent is extended or adjusted under 35 U.S.C. 154(b) by 47 days.

(21) Appl. No.: 11/038,275

(22) Filed: Jan. 21, 2005

(65) Prior Publication Data

US 2006/0163751 A1 Jul. 27, 2006

(51) Int. Cl.
*H01L 23/28* (2006.01)
*H01L 23/42* (2006.01)
*H01L 23/52* (2006.01)

(52) U.S. Cl. .................. 257/787; 257/777; 257/723; 257/686; 257/E23.116

(58) Field of Classification Search .......... 257/777, 257/723, 686, 787, E23.116
See application file for complete search history.

(56) References Cited

U.S. PATENT DOCUMENTS

| 5,031,092 | A | 7/1991 | Edwards et al. |
| 5,952,890 | A | 9/1999 | Fallisgaard et al. |
| 6,147,401 | A * | 11/2000 | Solberg ................. 257/723 |
| 6,417,026 | B2 * | 7/2002 | Gotoh et al. ............ 438/108 |
| 6,635,509 | B1 | 10/2003 | Ouellet |
| 6,661,084 | B1 * | 12/2003 | Peterson et al. ........ 257/680 |
| 6,699,730 | B2 | 3/2004 | Kim et al. |
| 6,708,132 | B1 | 3/2004 | Gutierrez et al. |
| 6,809,412 | B1 * | 10/2004 | Tourino et al. ......... 257/678 |
| 2005/0121413 | A1 * | 6/2005 | Weekamp ................ 216/13 |
| 2005/0151599 | A1 * | 7/2005 | Ido et al. ............... 333/133 |
| 2006/0001123 | A1 * | 1/2006 | Heck et al. ............ 257/528 |
| 2006/0153388 | A1 * | 7/2006 | Huang et al. ........... 380/279 |

OTHER PUBLICATIONS

Lawrence Rigge et al., "802.11 Wireless Chip Set Technology White Paper." Agere Systems, 2003, pp. 1-12.

* cited by examiner

*Primary Examiner*—Nitin Parekh
(74) *Attorney, Agent, or Firm*—Finnegan, Henderson, Farabow, Garrett & Dunner L.L.P.

(57) ABSTRACT

An integrated circuit package is disclosed having a semiconductor chip, a device supported by the semiconductor chip, and a molding compound sealing the semiconductor chip and the device together as a composite package. A method of manufacturing the package is also disclosed.

23 Claims, 7 Drawing Sheets

INTEGRATED CIRCUIT PACKAGE ENCAPSULATING A HERMETICALLY SEALED DEVICE

FIELD OF THE INVENTION

This invention pertains to integrated circuits, and more specifically, to an integrated circuit package for combining a sealed device with a semiconductor chip.

BACKGROUND OF THE INVENTION

The vast majority of integrated circuits today are sold in sealed packages, such as molded plastic resin packages. Although some of these packages may leak or outgas to some extent, the sealed packages protect the integrated circuits contained therein from stress and damage. Examples of these packages include ball-grid array packages, flip-chip packages, dual in-line packages, and quad-flat-packages.

Many integrated circuits require other devices to operate. For example, a microprocessor device may require access to a memory device. Typically, these devices can be placed on a printed circuit board and connected, or integrated, on a single substrate as described in U.S. Pat. No. 5,031,092 to Edwards, incorporated by reference herein.

U.S. Pat. No. 6,699,730 to Kim et al. and U.S. Pat. No. 6,708,132 to Gutierrez et al., both incorporated by reference herein, disclose multiple semiconductor chips provided in a single integrated circuit package. Such devices are typically referred to as multi-chip modules (MCMs). Other MCMs provide multiple sealed packages on a substrate, which are then mounted onto another substrate, such as a WL1141 Integrated PHY Module commercially available from Agere Systems, Inc.

Integration of different types of devices while still keeping the size of the module small, however, can be difficult. Different devices can require different materials to operate, and these devices cannot be integrated together. Other devices are fragile or difficult to produce and are preferably not combined with devices that are more robust or easier to make, as that would lower manufacturing yield. For example, U.S. Pat. No. 6,635,509 to Ouellet, incorporated by reference herein, discloses wafer-level packaging of a MEMs device. Such a device is difficult to produce with a high-yield. Some devices can be modified after they are manufactured to satisfy a particular need. For example, U.S. Pat. No. 5,952,890 to Fallisgaard et al., incorporated by reference herein, discloses a programmable oscillator.

Consistent with an aspect of the present invention, different types of devices are integrated in a small package. Such integration is achieved by providing an integrated circuit package that combines a sealed device with a semiconductor chip.

SUMMARY OF THE INVENTION

In accordance with one aspect of the invention, an integrated circuit package includes a semiconductor chip, a substrate for supporting the semiconductor chip, a sealed device supported by the semiconductor chip, and an encapsulant for sealing the semiconductor chip inside the package.

In accordance with another aspect of the invention, an integrated circuit package includes a sealed device, a substrate for supporting the device, a semiconductor chip supported by the device, and an encapsulant for sealing the semiconductor chip inside the package.

In accordance with yet another aspect of the invention, a method of manufacturing an integrated circuit package includes obtaining a sealed device, obtaining a substrate, obtaining a semiconductor chip, constructing the package such that the substrate supports the semiconductor chip and the device is supported by the device, and sealing the semiconductor chip inside the package.

In accordance with still another aspect of the invention, a method of manufacturing an integrated circuit package includes obtaining a sealed device, obtaining a substrate, obtaining a semiconductor chip, constructing the package such that the substrate supports the device and the semiconductor chip is supported by the device, and sealing the semiconductor chip inside the package.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Reference will now be made in detail to the present embodiments (exemplary embodiments) of the invention, examples of which are illustrated in the accompanying drawings. Wherever possible, the same reference numbers will be used throughout the drawings to refer to the same or like parts.

Figure 1:
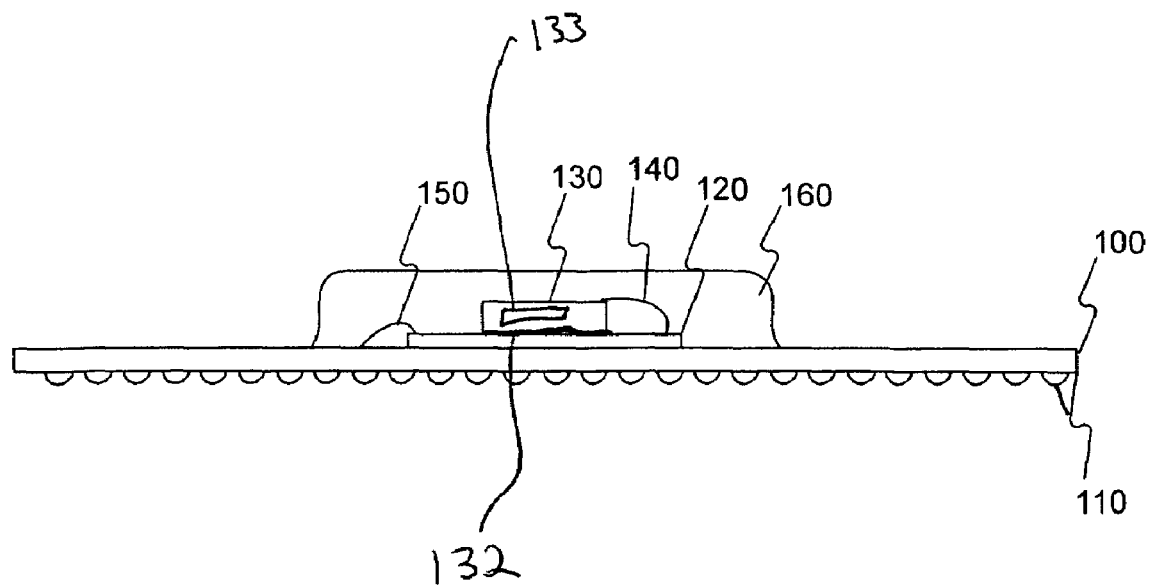
FIG. 1 is cross-sectional view of an integrated circuit package in accordance with an embodiment of the invention.
Figure 2:
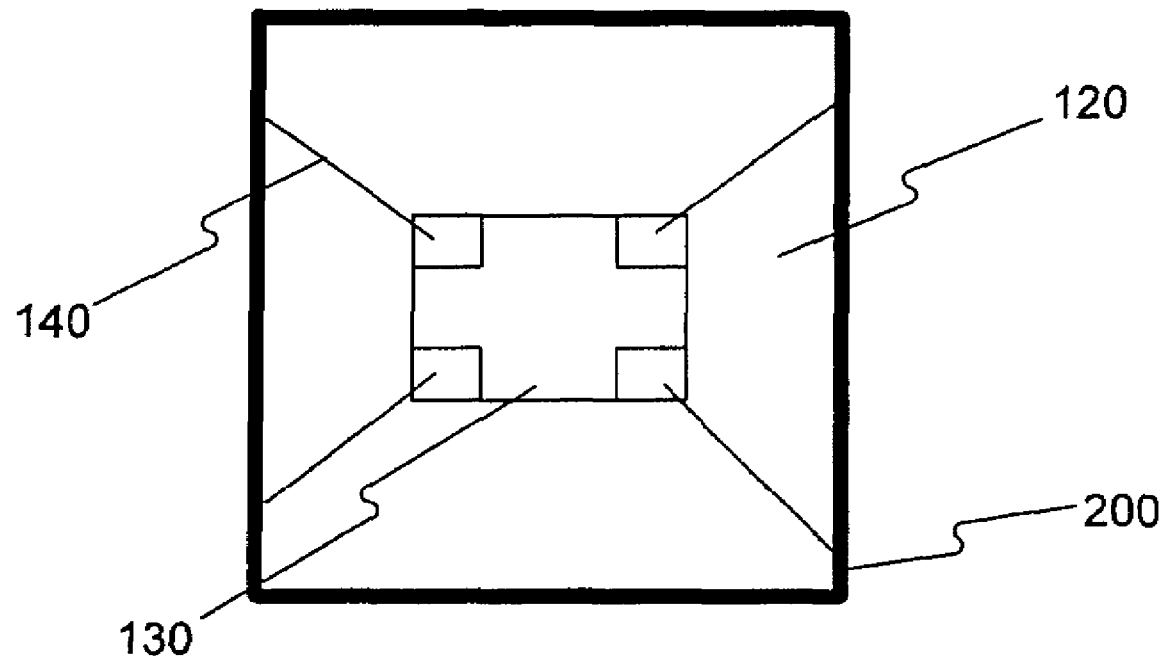
FIG. 2 is a top view of a sealed device stacked upon a semiconductor chip in accordance with an embodiment of the present invention.

FIGS. 1 and 2 illustrate an embodiment in accordance with the invention. FIG. 1 is side view of an integrated circuit package in accordance with an embodiment of the invention. FIG. 2 is a top view of a sealed device stacked upon a semiconductor chip in accordance with an embodiment of the present invention.

A substrate 100 provides a support for the components of a package 10. The present invention is not limited as to the form of the substrate and any form may be used, including, for example, a printed circuit board, a lead-frame, or tape. Electrical contacts 110, shown as balls in the embodiment of FIG. 1, are provided for connection to a printed circuit board, for example. The present invention, however, is not limited as to the form of the electrical contacts 110, and any suitable form of contact may be used.

A semiconductor chip (also known as a semiconductor die) 120, which is not sealed and could be unprotected, bare silicon or an unencapsulated semiconductor die with an integrated circuit formed thereon, is placed on the substrate 100 in a typical manner. For example, semiconductor chip 120 is could be bonded to the substrate 100 with an epoxy and typically includes any conventional integrated circuit. For example, semiconductor chip 120 could be a digital signal processor chip, such as Texas Instruments SM320C6201, a microprocessor, or a media access controller. Also, the top of the semiconductor chip may be "passivated" (such as by being protected by a thin coating of glass) and the depth of that layer may be adjusted to accommodate the subsequent process.

A sealed device 130 is placed on semiconductor chip 120. As shown in FIGS. 1 and 2, the sealed device 130 is bonded to semiconductor chip 120 with an epoxy (not shown). In other embodiments, the device could be placed directly on the semiconductor chip, particularly if other measures are taken to protect it from moving. Also, a buffer material 132, such as an interposer layer, could be placed between chip 120 and device 130. One or more heat sinks could also be provided, e.g., below chip 120, between chip 120 and device 130, or on top of device 130. Although not shown, other chips or devices could also be placed on device 130.

The chip 120 and device 130 can be electrically-interconnected. For example, wires 140 could connect contacts on the device 130 to bond pads on chip 120. In FIG. 2, wires 140 connect to a bonding ring 200 on chip 120. Also, bond pads of chip 120 and contacts of device 130 can be directly connected without using wires. Chip 120 is also electrically-interconnected to electrical contacts 110 by, for example, electrical wires 150 attached to wiring portions on substrate 100. Device 130 can also be connected to wiring portions of the substrate 100, using wires, for example.

Chip 120 and device 130 are preferably interconnected when the device 130 provides a necessary function for chip 120, such as a frequency source or memory.

In the preferred embodiment, device 130 includes a resonator circuit. For example, device 130 could be a programmable oscillator. Device 130 could also include quartz crystals, surface acoustic wave devices, or a MEMs structure, such as a resonator, sensor, or capacitive device. Nanotechnology devices could also be included in device 130, including quantum tunneling cooling devices, quantum tunneling power generation devices, and quantum resonant devices. These nanotechnology devices are usually provided in hermetically-sealed packages.

The package of device 130 significantly improves electrical and reliability performance for devices, such as resonators, sealed therein. Finally, it can provide protection against injection molding and similar encapsulation processes. Further, device 130 could be independently tested, programmed, or tuned prior to incorporation into package 10.

Encapsulant 160 seals chip 120 in the package of FIG. 1. Accordingly, chip 120 is protected from stress and damage. Because the chip 120 is not separately encapsulated (like device 130), the size of package is reduced. Moreover, by stacking device 130 on chip 120, further space savings can be achieved.

Figure 3:
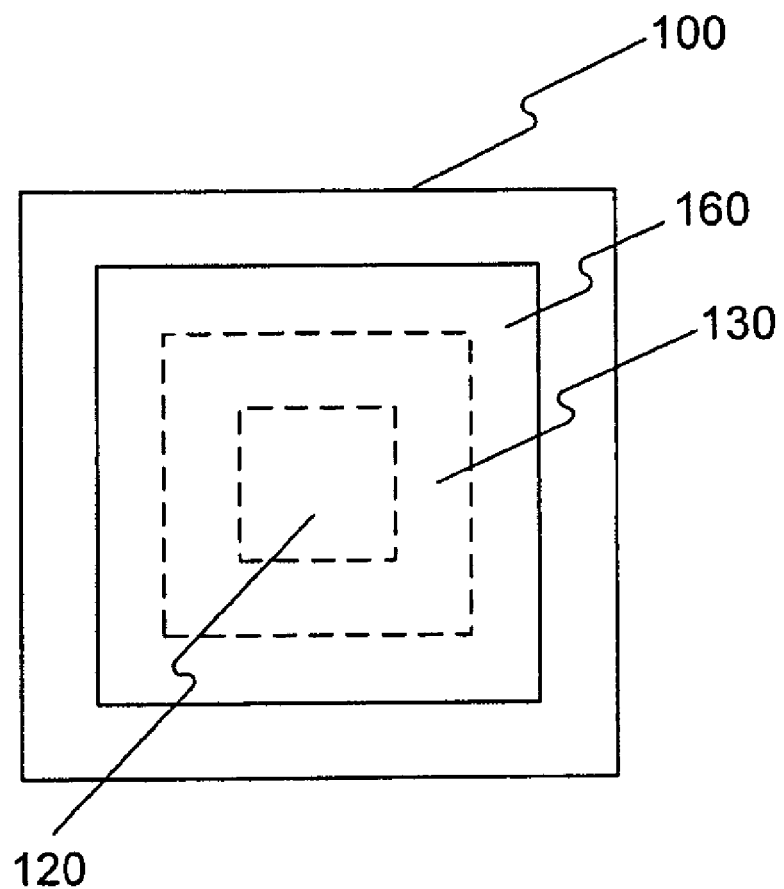
FIG. 3 is a top view of another configuration of a sealed device and a semiconductor chip in accordance with an embodiment of the present invention.

FIG. 3 shows a top view of another configuration a sealed device and a semiconductor chip in accordance with an embodiment of the present invention. In FIG. 3, chip 120 is placed on device 130.

Figure 4:
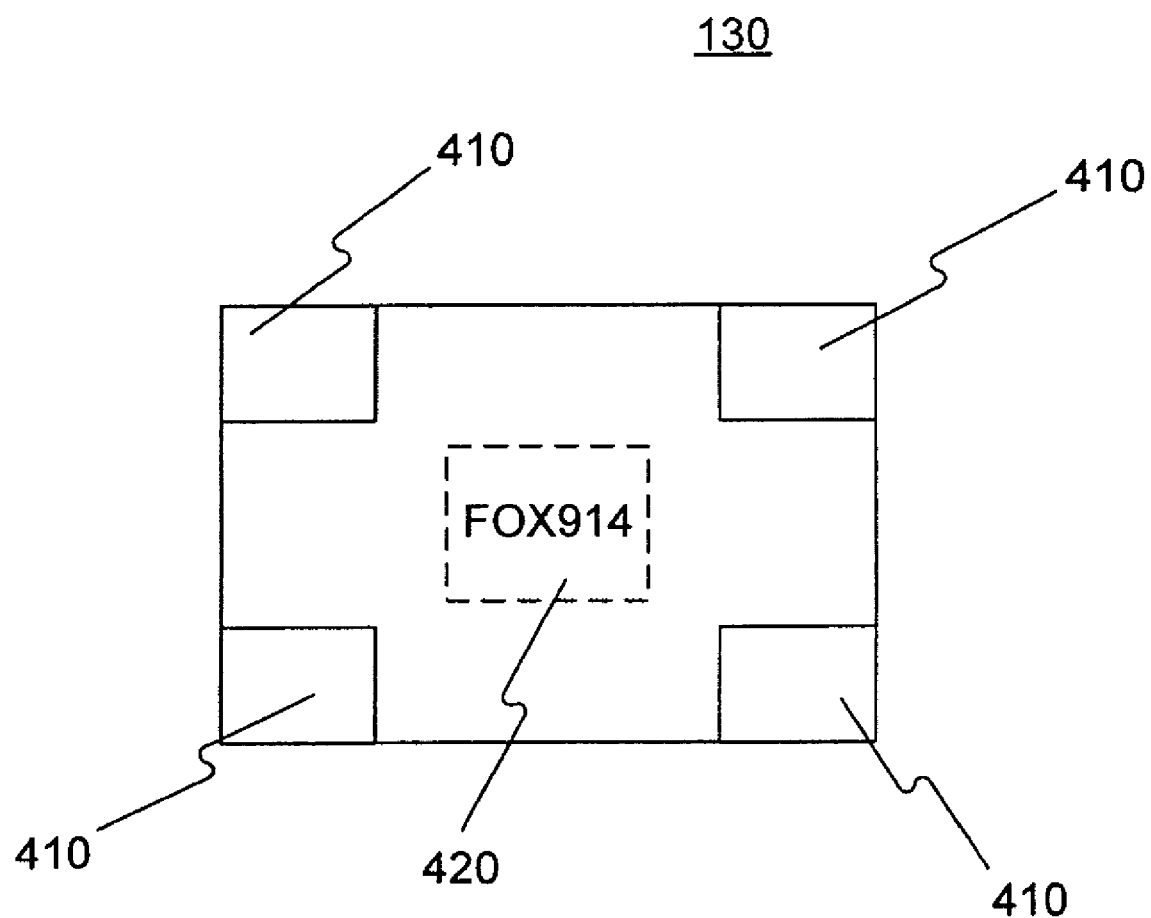
FIG. 4 is a bottom view of a sealed device in accordance with an embodiment of the present invention.

FIG. 4 shows an example of a sealed device 130 in accordance with the present invention. FIG. 4 shows a FOX914 oscillator 420, commercially available from Fox Electronics. It has four pads (sometimes referred to as pins) 410 for making electrical connections to chip 120 or wiring portions on a substrate 100. Optionally, the device shown in FIG. 4 could also be used, in some circumstances, in environments independent of the package of the present invention (e.g., as a stand-alone device on a circuit board). Other devices could be designed to be used only in connection with the package of the present invention.

Figure 5:
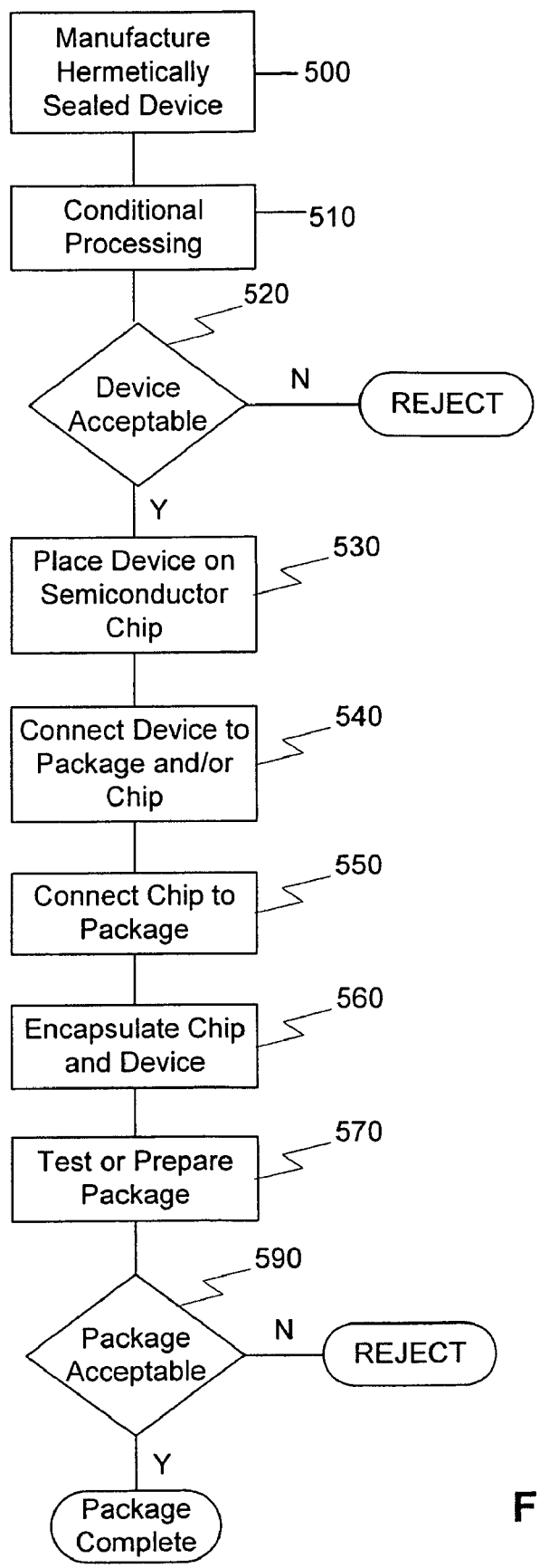
FIG. 5 describes a method of making a package in accordance with the present invention.

FIG. 5 describes a method of making a package in accordance with the present invention. In step 500, a sealed device is manufactured. In step 510, conditional processing or other post-manufacturing processes could be performed on the device, such as powering-up, programming, or testing. In step 520, a decision as to whether the sealed device is acceptable. If the device is not acceptable, it is rejected.

If the device is acceptable, then in step 530, the device is placed on a semiconductor chip. Alternatively, a chip could be placed on the device. In step 540, the device is connected to the package and/or the semiconductor chip. In step 550, the device is connected to the package. Note that the connections in steps 540 and 550 could be made in any order or simultaneously.

In step 560, the chip and device are encapsulated or sealed. In step 570, conditional processing or other post-encapsulation processes could be performed on the package, such as powering-up, programming, or testing. In step 580, a decision can be made to determine if the sealed device is acceptable. If the device is not acceptable, it is rejected. Otherwise, packaging is completed.

In each of the steps of FIG. 5, the person or entity performing the acts is not important. For example, manufacture of a sealed device could be performed by a person or company making the package or another person or company specializing in manufacture of hermetically-sealed devices. Also, the steps shown in FIG. 5 could be automated and carried out by an appropriately programmed computer-controlled robotic machine.

Figure 6:
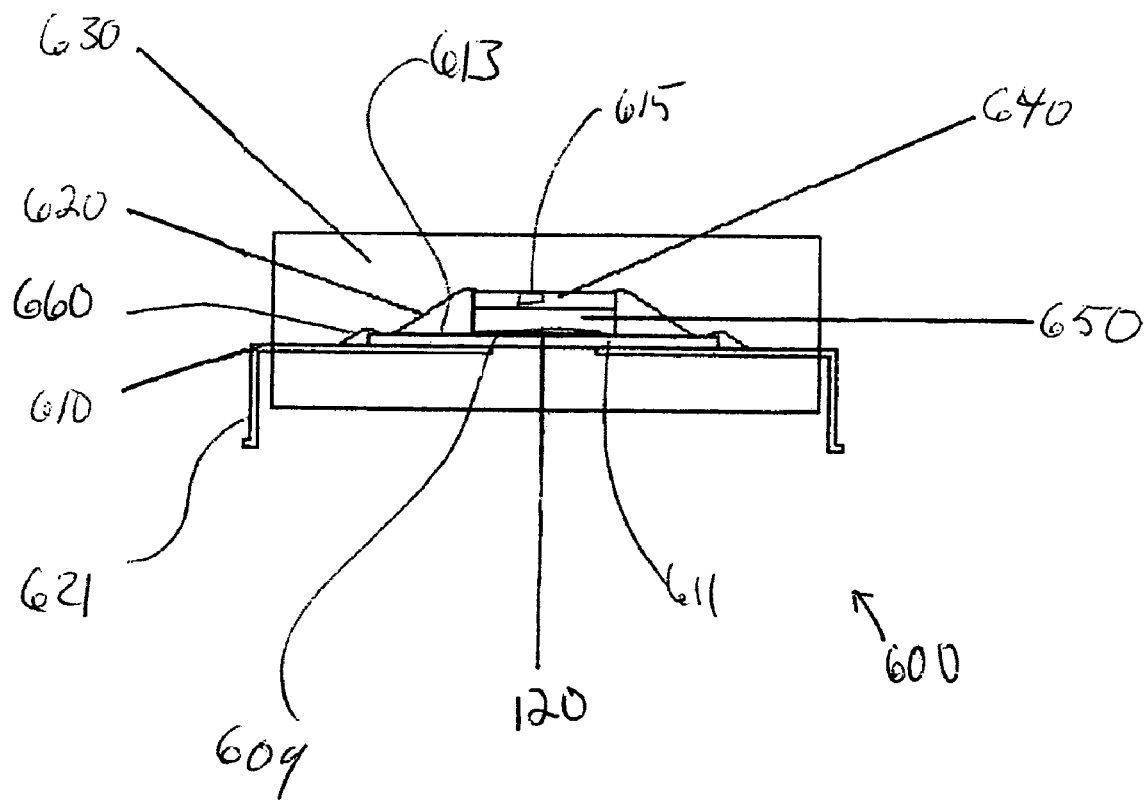
FIG. 6 illustrates an integrated circuit package consistent with a further aspect of the present invention.

FIG. 6 illustrates an integrated circuit package 600 consistent with a further aspect of the present invention. Integrated circuit package 600 includes a housing 650 attached to or supported by semiconductor die 120, having, for example, microprocessor circuitry disposed thereon. Housing 650 can be hermetically sealed. A crystal oscillator or other resonator discussed above can be provided in housing 650. Typically, hermetic housing 650 has a surface 611 having an area, which is less than area of surface 613 of semiconductor die 120.

An attachment portion 609 is provided between housing 650 and semiconductor die 120. Attachment portion 609 is configured to attach housing 650 to semiconductor die 120. In the example shown in FIG. 6, attachment portion 609 includes a known adhesive to bond housing 650 to semiconductor die 120.

As further shown in FIG. 6, an oscillator circuit 615 is provided in an oscillator package 640, which is disposed on housing 650. A first wiring 620 electrically couples oscillator circuit 615 to semiconductor die 120, and a second wiring 660 electrically couples semiconductor die 120 to lead frame 610. Lead frame 610 includes leads 621, which provide an external electrical connection. An encapsulant, such as molding package 630 formed of a known resin or molding compound collectively encapsulates or seals semiconductor die 120, housing 650, and oscillator package 630.

Figure 7:
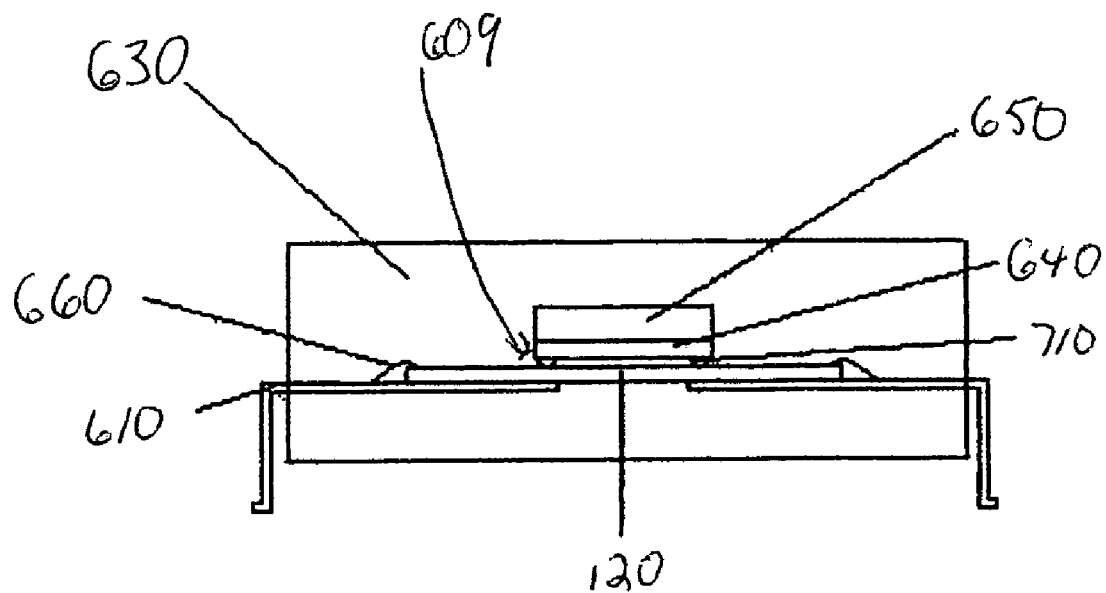
FIG. 7 illustrates an embodiment of the present invention.

The embodiment shown in FIG. 7 is similar to that illustrated in FIG. 6. In FIG. 7, however, attachment portion 609 includes oscillator package 640 and solder bumps 710, which provide an electrical connection or coupling between oscillator circuit 615 and semiconductor die 120. Attachment portion 609 may also include other packages and/or adhesives, or other structures configured to attach or bond housing 650 to semiconductor die 120. In both FIGS. 6 and 7, oscillator circuit 615 controls and senses a frequency output from housing 650.

Since housing 650 has a surface with an area less than that of semiconductor die 120, and further since housing 650 is attached to semiconductor die 120, greater integration can be achieved and a more compact package with greater functionality can be obtained.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An integrated circuit package, comprising:
   a semiconductor chip having a surface;
   a first conductor provided on the surface of the semiconductor chip;
   a hermetically sealed device supported by the semiconductor chip and provided on the surface of the semiconductor chip;
   a second conductor extending from a portion of the hermetically sealed device to the first conductor; and
   a molding compound sealing the semiconductor chip and the hermetically sealed device inside the package.

2. An integrated circuit package according to claim 1, wherein the hermetically sealed device includes a cavity.

3. An integrated circuit package according to claim 1, wherein the semiconductor chip is supported by a substrate, the substrate being selected from silicon, quartz, ceramic, glass epoxy, and a metal lead frame.

4. An integrated circuit package according to claim 1, further comprising electrical contacts disposed on the outside of the package.

5. An integrated circuit package according to claim 4, wherein the electrical contacts include solder balls.

6. An integrated circuit package according to claim 4, wherein the semiconductor chip is electrically-interconnected to the electrical contacts.

7. An integrated circuit package according to claim 6, wherein the semiconductor chip is electrically-interconnected to the electrical contacts with electrical wires attached to wiring portions on the substrate.

8. An integrated circuit package according to claim 4, wherein the hermetically sealed device is electrically-interconnected to the electrical contacts with electrical wires attached to wiring portions on the substrate.

9. An integrated circuit package according to claim 1, wherein the semiconductor chip is bonded to a substrate with an epoxy.

10. An integrated circuit package according to claim 1, wherein the semiconductor chip is a digital signal processor chip.

11. An integrated circuit package according to claim 1, wherein the semiconductor chip is a microprocessor.

12. An integrated circuit package according to claim 1, wherein the semiconductor chip is a media access controller.

13. An integrated circuit package according to claim 1, wherein the hermetically sealed device is provided in direct contact with the semiconductor chip.

14. An integrated circuit package according to claim 1, wherein a buffer material is disposed between the semiconductor chip and the hermetically sealed device.

15. An integrated circuit package according to claim 1, wherein the hermetically sealed device includes a contact, the first conductor includes a bond pad, and the second conductor includes a wire, the wire connecting the bond pad to the contact.

16. An integrated circuit package according to claim 1, wherein the hermetically sealed device and the semiconductor chip are electrically-interconnected without wires.

17. An integrated circuit package according to claim 1, wherein the hermetically sealed device includes a frequency source.

18. An integrated circuit package according to claim 1, wherein the hermetically sealed device includes a resonator circuit.

19. An integrated circuit package according to claim 1, wherein the hermetically sealed device is a programmable oscillator.

20. An integrated circuit package according to claim 1, wherein the hermetically sealed device includes a surface acoustic wave structure.

21. An integrated circuit package according to claim 1, wherein the hermetically sealed device includes a MEMs structure.

22. An integrated circuit package according to claim 21, wherein the MEMs structure is a resonator.

23. An integrated circuit package according to claim 21, wherein the MEMs structure is coupled to a surface acoustic wave structure.

* * * * *